United States Patent [19]

Chai

[11] Patent Number: 4,996,187
[45] Date of Patent: Feb. 26, 1991

[54] EPITAXIAL BA-Y-CU-O SUPERCONDUCTOR FILM

[75] Inventor: Bruce H. T. Chai, Bridgewater, N.J.

[73] Assignee: Allied-Signal Inc., Morris Township, Morris County, N.J.

[21] Appl. No.: 258,916

[22] Filed: Oct. 17, 1988

[51] Int. Cl.$^5$ ............................................. H01L 39/12
[52] U.S. Cl. ....................................... 505/1; 428/688; 428/930
[58] Field of Search .................... 156/610; 505/729, 1; 428/688, 930

[56] References Cited

FOREIGN PATENT DOCUMENTS 0345441 12/1989 European Pat. Off. .

OTHER PUBLICATIONS

Koren et al. Appl. Phys. Letts., 54 (Mar. 1989) 1054.
Hoehler et al. Appl. Phys. Letts. 54 (Mar. '89) 1066.
Sandstrom et al. Appl. Phys. Letts. 53 (Nov. 1988) 1874.
Simon et al. Appl. Phys. Letts. 53 (Dec. 1988) 2677.
Appl. Phys. Lett. 51, 852 (1987), B. Oh et al., "Critical Current Densities and Transport in Superconducting $YBa_2Cu_3O_{7-\delta}$ Films . . . etc."
Phys. Rev. Lett. 58, 908 (1987), M. K. Wu et al., "Superconductivity at 93 K In a New Mixed Phase Y–Ba–Cu–O Compound System at Ambient Pressure".
App. Phys. Lett. 52, 2077 (1988), A. Gupta et al., "Superconducting Oxide Films with High Transition Temperature Prepared from . . . etc."
Appl. Phys. Lett. 52, 2077 (1988), M. D. Kirk et al., "Scanning Tunneling Microscopy of the a-b planes of $Bi_2 (Ca,Sr)_3Cu_2O_{8+\delta}$ Single Crystal . . . etc."
Appl. Phys. Lett. 52, 2068 (1988), A. Mogro-Campero et al., "Characterization of Thin Films of Y–Ba–Cu–O on Oxidized Silicon . . . etc."
Appl. Phys. Lett. 52, 1990 (1988), Brian T. Sullivan et al., "Bi-Sr-Ca-Cu-oxide Superconducting Thin Films Deposited by dc Magnetron Sputtering".
Appl. Phys. Lett. 52, 1987 (1988), Ram P. Gupta et al., "Y–Ba–Cu–O Superconducting Film on Oxidized Silicon".
Appl Phys. Lett. 52, 1904 (1988), J. W. C. DeVries et al., "Preparation, Patterning, and Properties of Thin $YBa_2Cu_3O_{7-\delta}$ Films".
J. Cryst. Growth 85, 615 (1987), R. L. Henry et al., "Thin FIlm Growth of $YBa_2Cu_3O_x$ From Nitrate Solutions".
J. Cryst. Growth 85, 619 (1987), A. S. Edelstein et al., "Formation of the Structure of the Superconducting Phase of La-Sr-Cu-O by DC Sputtering".
Appl. Phys. Lett. 51, 861 (1987), X. D. Wu et al., "Epitaxial Ordering of Oxide Superconductor Thin Films on (100) $SrTiO_3$ Prepared by . . . etc."
Appl. Phys. Lett. 2, 1834 (1988), D. M. Hwang et al., "Transmission Electron Microscopy Studies of Superconducting Y–Ba–Cu–O Films . . . etc."
Ext. Abstracts, Mat. Res. Soc., Reno, Nevada, Apr. 5-9, 1988, A. D. Berry et al., p. 141, "High Temperature Superconductors II".
Appl. Phys. Lett. 52, 1743 (1988), A. D. Berry et al., "Formation of High $T_c$ Superconducting Films by Organometallic Chemical Vapor Deposition".
Jap. J. Appl. Phys. 27, L1265 (1988), Tomohiro Nakamori et al., "Superconducting Y–Ba–Cu–O Oxide Films by OMCVD".
Jap. J. Appl. Phys. 27, L1275 (1988), Hisanori Yamane et al., "$T_c$ of c-Axis-Oriented Y–Ba–Cu–O Films Prepared by CVD".
Appl. Phys. Lett. 53, 156 (1988), S. A. Kramer et al.

Primary Examiner—Upendra Roy
Attorney, Agent, or Firm—Gerhard H. Fuchs; Richard C. Stewart; Ernest D. Buff

[57] ABSTRACT

Superconducting structure are composed of thin film of Ba-Y-Cu-O superconductor epitaxially deposited on a crystal substrate of $SrLaAlO$, $SrLaGaO_4$, $SrPrGaO_4$, $SrNdGaO_4$, $SrSmGaO_4$, $SrEuGaO_4$, $CaLaGaO_4$, $CaPrGaO_4$, or $CaNdGaO_4$.

10 Claims, 3 Drawing Sheets

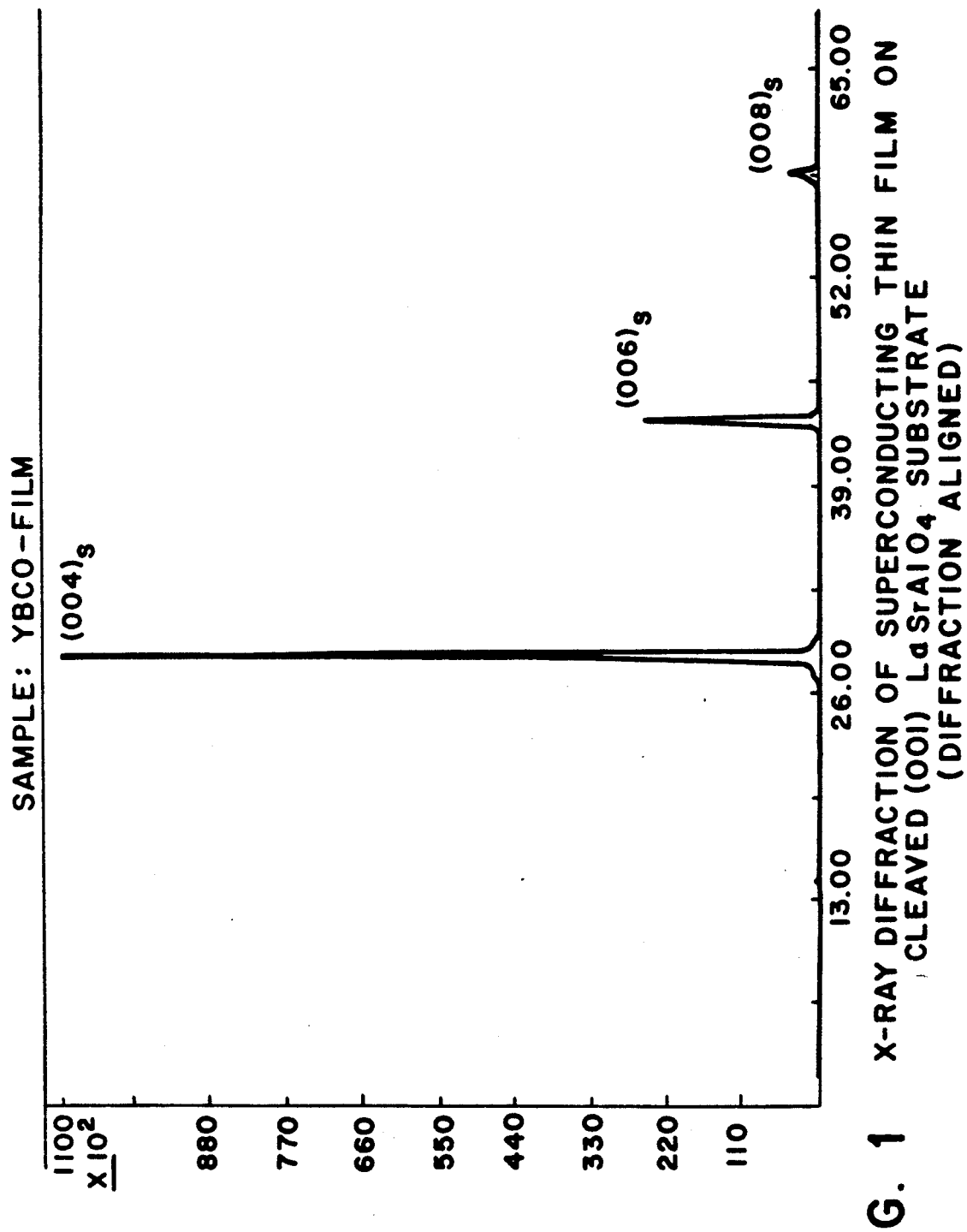

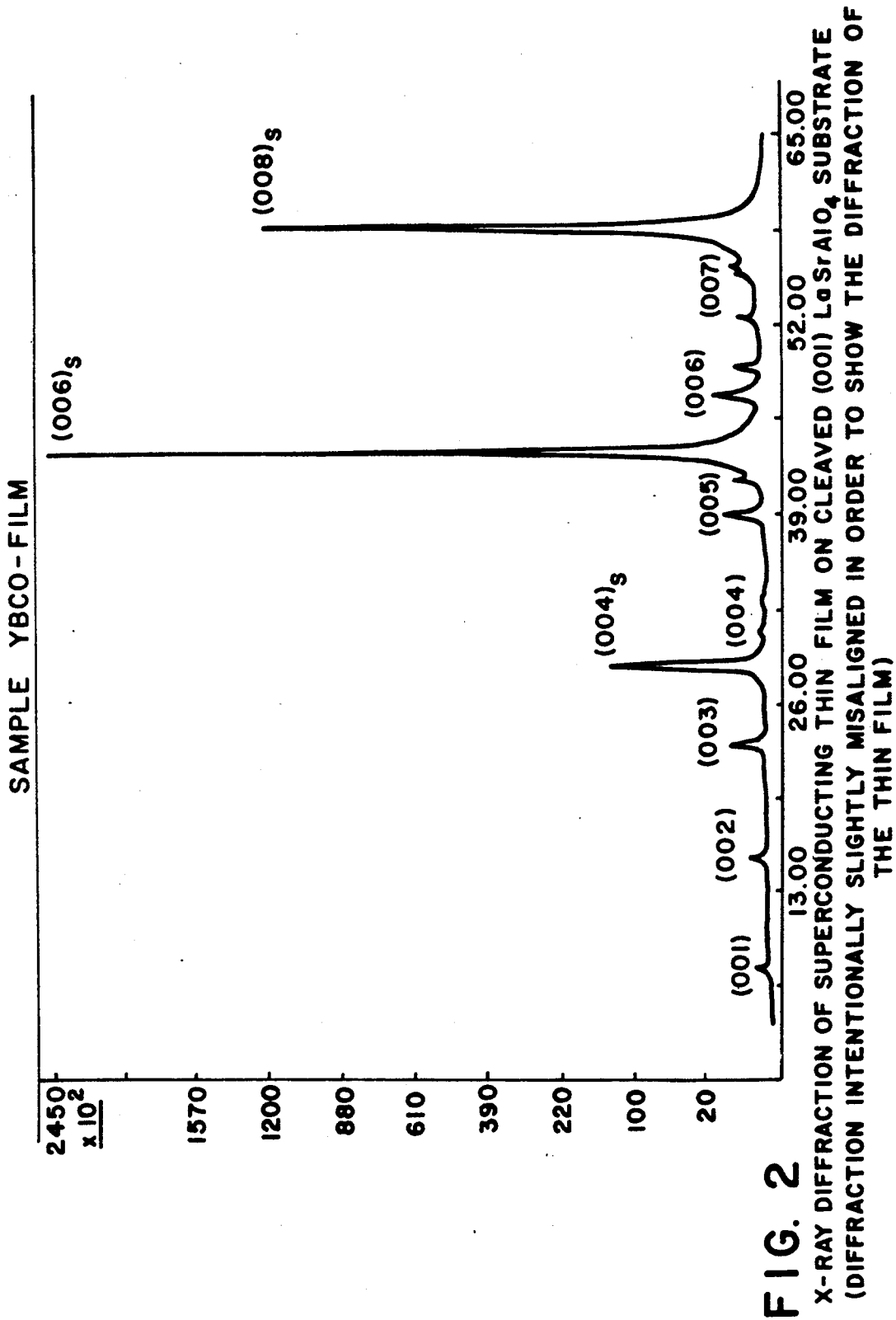
FIG. 2 X-RAY DIFFRACTION OF SUPERCONDUCTING THIN FILM ON CLEAVED (001) LaSrAlO₄ SUBSTRATE (DIFFRACTION INTENTIONALLY SLIGHTLY MISALIGNED IN ORDER TO SHOW THE DIFFRACTION OF THE THIN FILM)

Fig. 3 Photomicrograph of Annealed $YBa_2Cu_3O_{7-x}$ thin Film on $LaSrAlO_4$

EPITAXIAL BA-Y-CU-O SUPERCONDUCTOR FILM

BACKGROUND OF THE INVENTION AND THE PRIOR ART

Suggested applications of the recently discovered superconducting compounds, including superconducting ceramics composed of Ba-Y-Cu-O, include microelectronics. In such applications, thin films of the superconductor would provide electronic circuits. Prior efforts to provide a Ba-Y-Cu-O thin film superconductor include deposition thereof, by various means, onto crystalline substrates such as Si, GaAs, MgO, $Al_2O_3$, $BaTiO_3$, $(BaSr)TiO_3$, $SrTiO_3$, $ZrO_2$, glass and others. Although these deposited thin films were in some cases superconducting at liquid nitrogen temperature, none were truly epitaxial; all were polycrystalline. Depending on the method of preparation, the grain size in these polycrystalline films may vary from a few hundredth of a micron to several micron. The reason for polycrystalline film formation on these substrates is found in lattice mismatch between substrate and film. Among the substrates reported so far, $SrTiO_3$ has the closest lattice match (a=b=3.905 Å) to $Ba_2YCu_3O_{7-x}$ (a= 3.824 Å, b=3.884 Å). Indeed, film grown on $SrTiO_3$ had the best orientation and showed the highest critical current density of $10^5$ $A/cm^2$ at 77K, and $10^6$ $A/cm^2$ at 4.2K (Oh et al., Appl. Phys. Lett. 51, 852 (1987)).

Grain boundries in thin film superconductors are undesirable because they limit the performance of the material and introduce processing difficulties of making fine circuit patterns.

It is an object of the present invention to provide crystal substrates for epitaxial deposition of thin film Ba-Y-Cu-O type superconductors which provide sufficiently close lattice match between substrate and film.

SUMMARY OF THE INVENTION

I have found that certain $K_2NiF_4$-type structure compounds of the formulas $SrLnAlO_4$, $SrLnGaO_4$ and $CaLnGaO_4$, wherein Ln represents certain rare earth elements specific to each of these compounds, provide reasonably close lattice match with the Ba-Y-Cu-O type superconductors, sufficient to permit epitaxial deposition. In accordance with the present invention, there is provided a superconducting structure comprising, in combination, a crystal substrate having a superconducting film epitaxially deposited thereon, wherein the substrate is a crystal selected from the group consisting of $SrLaAlO_4$, $SrLaGaO_4$, $SrPrGaO_4$, $SrNdGaO_4$, $SrSmGaO_4$, $SrEuGaO_4$, $CaLaGaO_4$, $CaPrGaO_4$ and $CaNdGaO_4$, and wherein the superconducting film is a Ba-Y-Cu-O type superconductor, typically $Ba_2YCu_3O_{7-x}$ where x is from about 0.1 to about 0.5.

BRIEF DESCRIPTION OF THE DRAWINGS

In the attached drawings, FIG. 1 is an x-ray diffraction pattern of a Ba-Y-Cu-O thin film on a cleaved (001) $LaSrAlO_4$ substrate, (diffraction aligned):

FIG. 2 is another x-ray diffraction pattern of a Ba-Y-Cu-O thin film on a cleaved (001) $LaSrAlO_4$ substrate (diffraction intentionally slightly misaligned to show the diffraction of the thin film):

FIG. 3 is a photomicrograph of annealed Ba-Y-Cu-O thin film on an $LaSrAlO_4$ substrate.

DETAILED DESCRIPTION OF THE INVENTION, OF THE PREFERRED EMBODIMENTS, AND OF THE BEST MODE PRESENTLY CONTEMPLATED FOR ITS PRACTICE

In order to obtain epitaxial film growth on crystalline substrates, reasonably close match of lattice dimensions between film and substrate is required. Thicker films (>1 μm) especially require better match than thinner films. Typically, lattice mismatch should not be more than about 0.5 percent; preferably it is less than about 0.1 percent. Since the epitaxially deposited thin film is normally much thinner than the substrate, the tolerance under compression (substrate lattice smaller than the film lattice) is about twice that under tension. As can be seen from the data above, in the case of Ba-Y-Cu-O on $SrTiO_3$, the Ba-Y-Cu-O film is under tension in both the a and b direction. The mismatch is −0.081 Å (or −2.12 percent) in the "a" direction, and −0.021 Å (or −0.54 percent) in the "b" direction. This mismatch results in excessive tension which tends to break up the film into isolated islands.

Furthermore, the substrate material should not contain magnetic ions, such as Cr, Mn, Fe, Co or Ni, nor magnetic rare earth ions because these can have an adverse effect on the superconducting properties of the thin film (reduction of Tc due to splitting of Cooper pairs.

The substrate crystals employed in the superconducting structures of the present invention have the $K_2NiF_4$ modified perovskite structure, which matches the structure of the superconductor film to be epitaxially deposited thereon. The $K_2NiF_4$-type structure has tetragonal symmetry. The atomic arrangement on the (001) plane is identical to perovskite, only the stacking arrangement along the C-axis is different. This matters not, since for epitaxial growth of Ba-Y-Cu-O superconductor compounds the only concern for lattice match is in the (001) plane. The oxide analogs of $K_2NiF_4$ structure can be generalized as $A^{2+}B^{3+}C^{3+}O_4$ wherein A is an alkaline earth metal, B is a rare earth ion, and C is Al or Ga. Obviously, many combinations are possible. The substrate compounds of the present invention and their lattice dimensions and magnetic susceptibility are listed in the table below:

TABLE 1

| Compound | $a_o$ | $(a-a_o)/a$ % | $(b-b_o)/b$ % | magnetic susceptibility in $10^{-6}$ cgs units |
|---|---|---|---|---|
| $SrLaAlO_4$ | 3.765 Å | +1.54 | +3.06 | −78 |
| $SrLaGaO_4$ | 3.850 Å | −0.68 | +0.88 | +8994 |
| $SrPrGaO_4$ | 3.839 Å | −0.39 | +1.16 | +10200 |
| $SrNdGaO_4$ | 3.836 Å | −0.31 | +1.26 | +1988 |
| $SrSmGaO_4$ | 3.824 Å | −0.00 | +1.54 | +10100 |
| $SrEuGaO_4$ | 3.822 Å | +0.05 | +1.60 | −78 |
| $CaLaGaO_4$ | 3.822 Å | +0.05 | +1.60 | +8994 |
| $CaPrGaO_4$ | 3.810 Å | +0.37 | +1.91 | +10200 |
| $CaNdGaO_4$ | 3.807 Å | +0.44 | +1.98 | |

Of these, $SrLaGaO_4$, $SrSmGaO_4$ and $CaLaGaO_4$ are preferred, with $SrLaGaO_4$ and $CaLaGaO_4$ being more preferred, and $CaLaGaO_4$ being the most preferred compound.

The substrate crystals are prepared in conventional manner by mixing the oxide components in stoichiometric ratio, and heating the mixture in an appropriate furnace —e.g. a furnace equipped with R.F. heating coils—at temperature and for time sufficient to melt the charge, followed by slow cooling to form the crystal phase.

The oxide component raw materials should be of high purity, desirably at least about 99.99% purity. Their particle size is not critical, although fine powder form will aid in intimate mixing of the components, and facilitate initiation of the reaction. Once melting occurs, the reaction is reasonably fast, regardless of the particle size. No agitation is needed, and the heating rate is not a critical parameter. Melting of the oxides is desirably conducted in iridium vessels, in a low oxygen environment (less than about 1 vol. percent O2). These substrate compounds have melting points in the order of between about 1420° C. to 1650° C. Once the melt is formed, it is held for a while at a temperature above melt temperature to permit completion of the reaction and to homogenize the melt composition. Thereafter the melt is permitted to cool at a rate in the order of about 1° to 2° C./min. Cooling may take place in the melt crucible, in which case the melt freezes to form large grains, which then can be removed from the crucible and separated into single crystals. These crystals are then oriented in the desired plane, sliced and polished to provide substrates of the proper orientation.

To obtain larger substrates as are required for superconducting devices, it will ordinarily be desirable to conduct the crystal growth by the well known Czochralski process, which produces single crystal boules, which are then oriented in the usual manner, sliced and polished to provide substrate surfaces for deposition of the superconducting thin film.

Another method for growing the substrates for the superconductor structures of the present invention is the method which has become known as the "Tyco" method (LaBelle et al., "Growth of Controlled Profice Crystal from the Melt: Part I Sapphire Filaments", Mat. Res. Bull. 6 (1971) 571–580). That method employs a shaped capillary orifice, e.g. a tubular, annular, or ribbon-shaped capillary orifice to maintain the liquid level constant during crystal growth and to determine the shape of the growing crystal. In that process, in essence, the melt is "pulled" from the outlet of the shaped orifice into which it is raised through capillary action, to solidify into a single crystal of predetermined shape. The product crystal cross-section is determined by the shape of the orifice. The resultant product being a single crystal, it is eminently suited for deposition thereon of the Ba-Y-Cu-O superconductor to obtain a superconducting structure of the present invention.

The Ba-Y-Cu-O type superconductors are known, as is their preparation. They have first been reported by Wu et al. (Phys. Rev. Lett. 58, 908 (1987)).

Ba-Y-Cu-O superconductors have been applied by various methods as thin films onto a number of different substrates, including Si, GaAs, MgO, $Al_2O_3$, $ZrO_2$, $BaTiO_3$, $(BaSr)Ti_3$, $SrTiO_3$ and glass. These methods involved different deposition techniques for coating an oxidizable Ba, Y and Cu containing layer onto the surface of the substrate, generally followed by an oxidizing anneal. Any of these known methods may be used to deposit the Ba-Y-Cu-O type ceramic onto the substrates contemplated by the present invention to obtain the new epitaxial superconducting structures. These methods include: application of metal trifluoroacetate spin-on precursors (Appl. Phys. Lett. 52, 2077 (1988); electron beam co-evaporation of the metals (Appl. Phys Lett 52, 2072(1988); multi-layer evaporation process (Appl. Phys. Lett. 52, 2068 (1988); dc magnetron sputtering (Appl. Phys. Lett. 52, 1992 (1988); painting finely ground superconducting pellets suspended in binder on the substrate, followed by annealing in oxygen (Appl. Phys. Lett. 52, 1987 (1988)); triode sputtering (Appl. Phys. Lett. 52, 1904 (1988); application of nitrate solutions of the metals, followed by drying and oxidizing sintering (J. Cryst. Growth 85, 615 (1987)); reactive magnetron sputtering (J. Cryst. Growth 85, 619 (1987)); eximer laser evaporation and deposition (Appl. Phys. Lett. 51, 861 (1987), and Appl. Phys. Lett. 52, 1834 (1988)).

Another method for applying the Ba-Y-Cu-O type superconductor onto the specific perovskite substrates to obtain the superconducting structures of the present invention involves organo-metallic chemical vapor deposition. An appropriate procedure thereof is described and claimed in commonly assigned copending U.S. application Ser. No. 258,921, filed Oct. 17, 1988 by K. Beeson, G. West and I. Golecki for "Chemical Vapor Deposition of Superconducting Thin Films", filed of even date herewith (U.S. Ser. No. 258,921). Preparation of ceramic superconductor films by organo-metallic vapor deposition is also described in Extended Abstracts, Materials Research Society, Reno, Nev., Apr. 5–9, 1988, "High Temperature Superconductors II", p.141. See also Appl. Phys. Lett. 52, 1743 (1988); Jap. J. Appl. Phys. 27, L1265 (1988) Jap. J. Appl. Phys. 27, L1275 (1988).

The organo-metallic chemical vapor deposition procedure briefly involves passing a gas stream containing the metal components (Ba, Y and Cu) in form of a thermally decomposable precursor compound (typically a metal-organic compound or a metal-oxygen-organic compound) over the substrate, and thermally decomposing the compounds to deposit the metals (or metal oxides) onto the substrate. The gas stream contains the metal components in proper stoichiometric ratios so that the thin film of the ceramic superconductor which is deposited on the substrate, after all appropriate treatment, contains the metal components in the desired ratio. Typical thermally decomposable compounds for this process include the metal beta-diketonates, metal organic ethers as well as certain metal salts of carboxylic acids. For copper, these include the copper acetylacetonate and the 2,4-pentanedionate as well as the hexafluoracetylacetonate or the 1,1,1,6,6,6-hexafluoro-2,4-pentanedionate; and for yttrium and barium these include the acetylacetonates. All of these are commercially available compounds.

The actual deposition occurs inside a chamber which may be partially evacuated or at atmospheric pressure. The chamber is provided with means for heating the substrate to effect thermal decomposition of the precursor compound and deposition of the mixed metal and/or metal oxide film on the substrate. Most of the pecursors are solids at room temperature and must be heated to provide sufficient vapor pressure. Typically, the precursors are heated in separate reservoirs which are individually temperature controlled. An inert gas such as argon is flowed through the reservoirs, at rates determined to provide the metals in proper stoichiometric proportions to act as carrier to transport the vaporized precursor compounds to the decomposition chamber. Thereafter, the film so deposited is typically annealed at temperatures in the order of about 900° C. in an oxygen-containing atmosphere.

EXAMPLE 1

Preparation of SrLaAlO₄ substrate

The starting materials are equal molar amount of SrCO₃, La₂O₃ and Al₂O₃ powders of 99.99% purity. A total of 147.6 grams of SrCO₃, 325.8 grams of La₂O₃ and 102.0 grams of Al₂O₃ are mixed and placed in an 7.5 cm diameter iridium crucible inside an nitrogen purged chamber to prevent oxidation of Ir crucible, and are heated by an RF heating coil. The SrLaAlO₄ melts at 1755° C. The melt is left to soak at temperature slightly higher than melting temperature for a couple of hours to facilitate the reaction and to homogenize the melt composition. SrLaAlO₄ seed is dipped into the melt and the SrLaAlO₄ crystal is grown by the Czochralski pulling technique. Typical pulling rate is about 1 to 3 mm per hour and seed rotation rate is about 15 rpm. As the growth is completed the crystal is separated from the melt and cooled slowly to prevent cracking. The as grown crystal is then oriented by Laue x-ray photograph technique on a goniometer head. The substrate orientation is (001). The crystal boule is then sliced and polished to produce substrate wafers.

EXAMPLE 2

Deposition of thin film epitaxial Ba-Y-Cu-O onto an SrLaAlO₄ substrate by CVP The metalorganic precursors are yttrium 2,2,6,6-tetramethyl-3,5-heptanedionate [Y(thd)₃], barium 2,2,6,6-tetramethyl-3,5-heptanedionate [Ba(thd)₂] and copper 2,2,6,6-tetramethyl-3,5-heptanedionate [Cu(thd)₂]. The Y(thd)₃, Ba(thd)₂ and Cu(thd)₂ are kept in separate heated reserviors at temperatures of 121° C., 205° C. and 122° C, respectively. Argon gas flows through each reservior at a rate of 10 sccm (standard cubic centimeters per minute) to act as a carrier. The three gas streams are combined and mixed with 90 sccm of oxygen before entering the deposition chamber. The deposition chamber is a 2 inch diameter fused silica tube positioned inside a tube furnace and heated to 450° C. The total pressure inside the chamber is maintained at 0.5 Torr by a vacuum pump and throttling valve. Sample substrates, in this case SrLaAlO₄ are placed inside the chamber and deposition is allowed to proceed for 1 hour resulting a film approximately 0.5 micron thick. After 1 hour the metaorganic precursor flows are stopped, the chamber pressure is increased to 1 atmosphere, and the samples are in situ annealed for 1 hour in a flow of 300 sccm oxygen. A subsequent second anneal at 900° C. for 30 minutes in flowing oxygen (300 sccm) followed by slow cooling to room temperature results in the formation of the Y-Ba-Cu-O 1-2-3 crystal phase.

EXAMPLE 3

Preparation of CaLaGaO₄ substrate

Following the procedure of Example 1 the CaLaGaO₄ substrate is prepared employing equal number amounts of CaO, La₂O₃ and Ga₂O₃.

EXAMPLE 4

Deposition of thin film Ba-Y-Cu-O onto an CaLaGaO₄ substrate by DC magnetron sputtering A stoichiometric $YBa_2Cu_3O_{7-x}$ disk prepared by a standard sintering process (sintered at 900° C. followed by slow cooling in oxygen atmosphere) is used as target. A cleaned CaLaGaO₄ substrate, obtained as described in Example 3, above, is used for deposition. The sputtering chamber is pre-pumped to $10^{-6}$ Pa and 1 Pa oxygen is introduced in the chamber mixed with argon with a total 5 Pa pressure. Sputtering is achieved with voltage of 200 V and current of 0.4 A. The deposited film is subsequently annealed for 1 min at 900° C. in oxygen.

EXAMPLE 5

Deposition of thin film Ba-Y-Cu-O onto a SrLaGaO₄ substrate by sol-gel deposition procedure The SrLaGaO₄ substrate is prepared from equimolar amounts of 99.99% + purity of the oxides of Sr, La and Ga, following the procedure of Example 1.

The $YBa_2Cu_3O_{7-x}$ thin film is deposited onto the substrate thus obtained by spin casting the partially hydrolyzed stock solution onto a single crystal substrate of LaAlO₃. The stock solution is a mixture of copper (II) ethoxide/toulene suspension with Bamethoxyethoxide and Y-methoxythoxide in the Y:1, Ba:2, Cu:3 molar ratio. The resulting film (about 1000 Å in thickness) is then dried in an oven and fired in a flow of oxygen at 850° C. for about 30 minutes. It then cools slowly (100° C./hr) to room temperature. Ref: S.A. Kramer et al., Apply. Phys. Lett. 53, 156 (1988).

Lattice matching can be greatly improved by cutting the substrate in the form of a wafer tilted relative to the (001) plane. The Ba-Y-Cu-O superconductor compound is orthorhombic in symmetry with a = 3.824 Å and b = 3.884 Å. Tilting therefor is only applicable to substrates having dimensions smaller than 3.884 Å. Moreover, for practical purposes, a single tilt is recommended for ease of orientation, and because double tilting will generate undesirable twisting deformation. The expedient of using tilted cuts to accommodate lattice mismatch has previously been resorted to for growing GaAs epitaxial layers on Si substrates (Fisher et al., J. Appl. Phys. 60, 1640 (1986). The optimum tilt angles relative to the (001) plane in the b direction for the substrates used for making the superconducting structures of the present invention are listed in Table 2 below:

TABLE 2

|  | tilt angle |
|---|---|
| SrLaAlO₄ | 14.2° |
| SrLaGaO₄ | 7.6° |
| SrPrGaO₄ | 8.7° |
| SrNdGaO₄ | 9.0° |
| SrSmGaO₄ | 10.1° |
| SrEuGaO₄ | 10.3° |
| CaLaGaO₄ | 10.3° |
| CaPrGaO₄ | 11.2° |
| CaNdGaO₄ | 11.4° |

Since various changes and modifications may be made in the invention without departing from its spirit and essential characteristics, it is intended that all matter contained in the description shall be interpreted as illustrative only and not in a limiting sense, the scope of the invention being defined by the appended claims.

I claim:

1. A superconducting structure comprising, in combination, a crystal substrate having a superconducting film epitaxially deposited thereon, wherein wherein the substrate is a crystal selected from the group consisting of SrLaAlO₄, SrLaGaO₄, SrPrGaO₄, SrNdGaO₄, SrSmGaO₄, SrEuGaO₄, CaLaGaO₄, CaPrGaO₄ and CaNdGaO₄, and wherein the superconducting film is a Ba-Y-Cu-O type superconductor.

2. The structure of claim 1 wherein the substrate is a crystal of $SrLaGaO_4$, $SrSmGaO_4$, or $CaLaGaO_4$.

3. The structure of claim 1 wherein the substrate is a crystal of $SrSmGaO_4$.

4. The structure of claim 1 wherein the substrate is a crystal of $CaLaGaO_4$.

5. The structure of claim 1 wherein the Ba-Y-Cu-D type superconductor has the formula $Ba_2YCu_3O_{7-x}$ wherein x is from about 0.1 to about 0.5.

6. The structure of claim 5 wherein the substrate is a crystal of $SrLaGaO_4$, $SrSmGaO_4$, or $CaLaGaO_4$.

7. The structure of claim 5 wherein the substrate is a crystal of $SrSmGaO_4$.

8. The structure of claim 5 wherein the substrate is a crystal of $CaLaGaO_4$.

9. The structure of claim 5 wherein the substrate crystal is oriented in the (001) direction.

10. The structure of claim 5 wherein the substrate crystal has been obtained by the Czochralski process.

* * * * *